United States Patent
Kawakami

(10) Patent No.: US 7,801,709 B2
(45) Date of Patent: Sep. 21, 2010

(54) SIMULATION METHOD USING A SIMULATION SYSTEM THAT PROVIDES INFORMATION ON A TRANSFER PATTERN OF A PREDETERMINED MASK PATTERN TRANSFERRED TO A WAFER BY OPTICAL PHOTOLITHOGRAPHY AND METHOD OF MODIFYING MASK PATTERN

(75) Inventor: Yukiya Kawakami, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 417 days.

(21) Appl. No.: 11/755,303

(22) Filed: May 30, 2007

(65) Prior Publication Data
US 2008/0140365 A1 Jun. 12, 2008

(30) Foreign Application Priority Data
May 31, 2006 (JP) .............................. 2006-151244

(51) Int. Cl.
G06F 17/50 (2006.01)
(52) U.S. Cl. ........................................... 703/2; 716/19
(58) Field of Classification Search .................. 703/14, 703/2; 716/19
See application file for complete search history.

(56) References Cited

U.S. PATENT DOCUMENTS

| 7,090,949 | B2 * | 8/2006 | Nojima et al. | 430/5 |
| 7,473,495 | B2 * | 1/2009 | Tanaka et al. | 430/5 |
| 2004/0227921 | A1 * | 11/2004 | Sato et al. | 355/69 |
| 2005/0089768 | A1 * | 4/2005 | Tanaka et al. | 430/5 |
| 2005/0278686 | A1 * | 12/2005 | Word et al. | 716/21 |
| 2006/0039597 | A1 * | 2/2006 | Kotani et al. | 382/144 |
| 2007/0006115 | A1 * | 1/2007 | Nojima et al. | 716/19 |

FOREIGN PATENT DOCUMENTS

JP 2005-181636 7/2005

OTHER PUBLICATIONS

Universal Process Modeling With VTRE for OPC, Yuri Granik et al, Mentor Graphics Corp., 1001 Ridder Park Dr., San Jose, CA 95131; Optical Microlithography XV, Anthony Yen, Editor, Proceedings of SPICE vol. 4691(2002) pp. 377-394.
The Journal FO Chemical Physics 122, 024715 (2005), Nonadiabatic photodissociation process using an optical near field, Tadashi Kawazoe et al; 024715-1 to 024715-5.

* cited by examiner

Primary Examiner—Paul L Rodriguez
Assistant Examiner—Aniss Chad
(74) Attorney, Agent, or Firm—Young & Thompson

(57) ABSTRACT

A simulation system includes an input acceptance unit that accepts a measured dimension of a transfer pattern; a calculation unit including a light intensity calculation unit that calculates a light intensity at each position, and a modified light intensity calculation unit that adds a modified value including the product of the light intensity and a tentative optical reaction coefficient to the light intensity, thereby giving a modified light intensity; and a decision unit that decides the threshold value and optical reaction coefficient by regression calculation such that a difference between the measured dimension and the calculated dimension becomes minimal under the modified light intensity, with a constant being the threshold value of the light intensity at a pair of edges defining the calculated dimension of the transfer pattern in the simulation.

5 Claims, 20 Drawing Sheets

FIG. 20
LIGHT INTENSITY
(LIGHT INTENSITY DISTRIBUTION)
POST-DIFFUSION MODIFIED
LIGHT INTENSITY
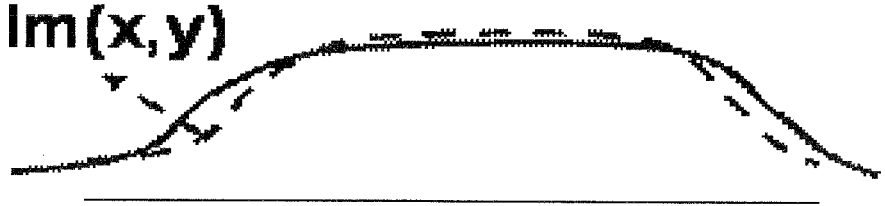
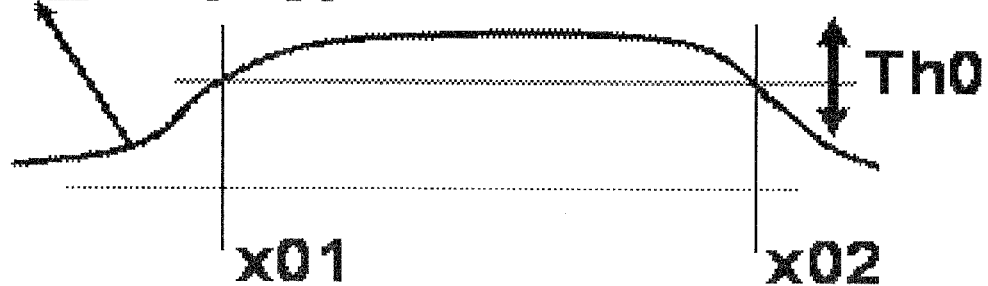

US 7,801,709 B2

SIMULATION METHOD USING A SIMULATION SYSTEM THAT PROVIDES INFORMATION ON A TRANSFER PATTERN OF A PREDETERMINED MASK PATTERN TRANSFERRED TO A WAFER BY OPTICAL PHOTOLITHOGRAPHY AND METHOD OF MODIFYING MASK PATTERN

This application is based on Japanese patent application No. 2006-151244, the content of which is incorporated hereinto by reference.

BACKGROUND

1. Technical Field

The present invention relates to a simulation method and a simulation system that provide, through simulation, information on a transfer pattern of a predetermined mask pattern transferred to a wafer by optical photolithography, and to a method of modifying the mask pattern.

2. Related Art

Based on the latest progress in semiconductor device manufacturing technology, the minimum feature size of the semiconductor device has now reached 90 nm or even smaller. Such scaling has been achieved because of the progress in fine pattern formation techniques including mask process techniques, photolithography techniques and etching techniques. During the era that exposure equipments utilized an i-line (365 nm) and g-line (436 nm) and the pattern size was sufficiently larger than the light wavelength of the exposure equipments, transferring an LSI pattern on a mask as it is a plane figure of the LSI pattern to be formed on a wafer, again transferring the obtained mask pattern on the wafer by a projection optical system, and performing an etching process on the base layer could provide a pattern substantially identical to the original LSI pattern, on the wafer. The progress in scaling of the pattern, however, has made it so difficult to feasibly transfer or form the pattern in each process, that a final finishing dimension (critical dimension, hereinafter CD) can no longer reproduce the dimension (CD) of the original LSI pattern.

Especially in the lithography and etching process, which are the critical processes for attaining the highly scaled patterns, the dimensional accuracy (CD accuracy) of the pattern to be formed has come to largely fluctuate depending on the layout of other patterns disposed in the periphery of the object pattern. In order to restrain such fluctuation, an optical proximity correction (hereinafter, OPC) technique has been introduced so as to modify in advance an edge and corner portion of the mask pattern, where the fluctuation prominently takes place, so that the dimension after the process becomes the desired value.

Currently, because of the complication in the OPC technique, the LSI pattern created by a designer and the mask pattern actually used for exposure are so different from each other, that it is difficult to predict how the pattern will be finally formed on the wafer. Accordingly, the following steps are taken when applying the OPC to the mask pattern.

Firstly, a lithography model is made up, by incorporating both a measured value (measured CD) and a calculated value (calculated CD) of a sample mask pattern, through empirical lithography simulation. The lithography model allows, by principle, predicting a finished pattern shape of a given LSI pattern on the wafer, as long as the exposure conditions are the same as those for the sample mask pattern. Therefore, the lithography model can serve as a guideline for selection on the OPC is to be applied, and allows confirming whether the selected OPC is appropriate, through calculation of the finished pattern shape on the wafer, to be obtained by application of the selected OPC process.

Prior art related to the present invention includes Japanese Laid-open patent publication No. 2005-181636, as well as non-patented documents (Yuri Granik, Nick Cobb and Thuy Do, "Universal Process Modeling with VTRE for OPC", Optical Micrography XV, Proceedings of SPIE Vol. 4691 (2002), pp. 377-394, T. Kawazoe, K. Kobayashi, S. Takubo and M. Ohtsu, "Nonadiabatic photodissociation process using an optical near field", J. Chem. Phy., Vol. 122, 024715 (2005), Tadashi Kawazoe et al., 2006 Spring Meeting, The Japan Society of Applied Physics, 25a-ZB-2 "Transfer of a pattern finer than 100 nm by near-field optical lithography" and Hiroki Yonemitsu et al., 2006 Spring Meeting, The Japan Society of Applied Physics, 25a-ZB-3 "Irradiation time dependence of a photosensitive region in near-field optical lithography").

In order to properly perform the OPC, it is indispensable that the measured CD to be input to the empirical lithography simulation, and the empirical lithography simulation itself, are very accurate. The following passages cover the principle and current drawback of the simulation.

FIG. 9 illustrates, from the top, a mask pattern in a plan view, a light intensity distribution in the lithography simulation on a cross-section of a photoresist on a wafer, and a resolution pattern of the photoresist after exposure in a plan view. Although the mask pattern is usually projected on the wafer with reduction ratio of ¼ to ⅕, the projected pattern is in equal magnification in FIG. 9, for the sake of explicitness. In the case of projection lithography, if the value after the reduction is construed to represent the design value (mask CD), the description may be made hereunder as if it were the life-size case.

In FIG. 9, a wafer (not shown) is irradiated with light through an aperture of the mask, thereby presenting distribution of the light intensity depending on the location. A photochemical reaction progresses in the photoresist on the wafer depending on the light intensity such that, in a region where the quantity of reacted molecules has exceeded a certain ratio with respect to the initial total quantity of the molecules, the positive photoresist as shown in FIG. 9 is dissolved in the developing solution (in the case of a negative resist, the resist remains after the development). Accordingly, the threshold value of the quantity of the reacted molecules, which determines the resolution, corresponds to a certain light intensity value. This may be considered that a boundary in resolution is determined by a threshold value of the light intensity.

FIG. 9 is completely symmetrical. Here, the design value (mask CD) and the measured value (measured CD) are usually different. The central portion of FIG. 9 will be described in details referring to FIG. 10.

In FIG. 10, a wafer (not shown) is irradiated with light through an aperture of the mask, thereby presenting distribution of the light intensity depending on the location. A coordinate system along which the CD increases from an origin point located at the left edge of the mask will be denoted as the coordinate system x1, and a coordinate system along which the CD increases from an origin point located at the right edge of the mask will be denoted as the coordinate system x2. The coordinate of the mask can be directly read out from the design data, which is electronic data. On the other hand, although the measured value (measured CD) can be apparently obtained from the measuring equipment, the coordinate of the two edges defining that CD cannot be identified, unless measured from a reference point (fixed point) that is known to be immobile. Now, FIG. 10 shows a symmetrical pattern.

Since the edges of the photoresist are considered to be located at positions respectively shifted from the two mask edges by an error value, i.e. (measured value−design value)/2 which is a negative value on the coordinate x1 and the coordinate system x2, the coordinate of the two edges can be identified. When the light intensity values (I1(x1), I2(x2)) of those photoresist edges are denoted as a threshold value Th, the photoresist edge of any mask pattern can be obtained in the lithography simulation, by applying a two-dimensional light intensity distribution to given mask pattern in the lithography simulation and identifying the edges based on the threshold value Th.

In a simplest empirical lithography simulation based on the foregoing principle, the light intensity is provided according to the optical system, and an optical parameter and an average threshold value are determined through a regression calculation or statistical process, so that the CD that is equal to the measured CD can be obtained through calculation at numerous measurement points. Such process is called a creation of a lithography model. Once the light intensity distribution and the threshold value (i.e. the lithography model) are determined, the CD in the resolution pattern of the photoresist can be predicted, with respect to a given mask.

Since the pattern shown in FIG. 10 is a symmetrical pattern, only either side may be focused on. FIG. 11 only illustrates the left side of FIG. 10. The edge of the resolution pattern of the photoresist is located at the position shifted by an error value, i.e. (measured value−design value)/2 which is a negative value on the coordinate x1, and the light intensity value I1(x1) on this edge is the threshold value Th. Thus, without the need to provide the measured CD, providing the error value leads to determination of the threshold value Th in this mask pattern.

It is clarified, however, that the threshold values vary depending on the patterns. For example, when a mask CD2 in FIG. 12 is smaller than the mask CD in FIG. 10, a threshold value in FIG. 12 is lower than the threshold value in FIG. 10. When a mask CD3 in FIG. 13 is larger than the mask CD in FIG. 10, a threshold value in FIG. 13 is higher than the threshold value in FIG. 10. The differences among FIGS. 10, 12, and 13 correspond to the differential coefficients (light intensity gradients) according to the location of I1(x1), I2(x2) on the respective threshold values. In other words, the threshold value also depends on the light intensity gradient, and is hence a value that varies depending on the location.

In this case, in the empirical lithography simulation, the light intensity is provided according to the optical system, and the threshold value Th and the light intensity gradient at the edge corresponding to that threshold value are determined at each measurement point, to thereby determine the function of the threshold value through the regression calculation or statistical process, so that the CD that is equal to the measured CD can be obtained through calculation at numerous measurement points. Once the light intensity and the threshold value—which is the function of the light intensity gradient—are determined, the CD in the resolution pattern of the photoresist can be predicted, with respect to a given mask pattern.

Actually, however, the patterns the CD of which has to be measured not only include those symmetrical patterns in which the edges are always located at positions shifted by an error value, i.e. (measured value−design value)/2 from the edge of the mask. On the contrary, the large majority of patterns are asymmetrical. FIG. 14 illustrates an asymmetric pattern. As is apparent upon comparison of FIG. 9 and FIG. 14, since the distances on the left and the right sides between adjacent apertures are different, the light intensity in the aperture illustrated in the central portion of FIG. 14 is naturally asymmetric. The central portion of FIG. 14 will be described in details referring to FIG. 15.

In FIG. 15, light passes through an aperture of the mask, thereby inducing distribution of the light intensity depending on the location. If distances L1, L2 from a fixed point to two edges are known, the respective threshold values can be obtained. In FIG. 15, the error values from the edge of the mask on the left and the right sides are different. Such state is expressed as that an edge placement error (EPE) has emerged. In the case of the asymmetric pattern, therefore, the fixed point for identifying the edge of the resolution pattern of the resist is indispensable.

An example of the fixed point is shown in FIG. 16. The fixed points are disposed at symmetrical locations in a horizontal and vertical direction, and isolated from one another on the mask so as to be free from influence of other patterns. Since the centers of the patterns remain immobile irrespective of variation in exposure intensity, these points can be utilized as an origin point of a coordinate. Here, a region is necessary for incorporating the fixed points into the mask pattern. The shorter a distance from the fixed point is, the more accurately that distance can be measured, however there are cases where the distance cannot be made shorter because of designing restriction, or where no room for incorporating the fixed point is available. Also, in the case where the fixed points are incorporated at first but removed when running the mass production, a change of the mask may cause deviation from the prediction based on the lithography model established through the lithography simulation. Thus, incorporating the fixed point imposes significant restriction on the layout design.

Although it may be possible to analyze the asymmetric pattern without incorporating the fixed point based on the fact that the measured CD and the calculated CD always agree and that the threshold value depends on the light intensity gradient, such calculation is complicated. The dependence of the threshold value on the light intensity gradient is described, for example, in Japanese Laid-open patent publication No. 2005-181636. This document discloses that the threshold value constitutes a second order function of the positional shift (error value). When the pattern is symmetrical, the positional shift can be obtained from the threshold value, because the threshold values at the two edges defining the CD are the same. When the pattern is asymmetric, however, the light intensity gradients are different and hence the threshold values are different, between the two edges defining the CD. Accordingly the positional shifts from the two edges are also different. Thus, the technique of Japanese Laid-open patent publication No. 2005-181636 is ineffective with the asymmetric pattern in obtaining the accurate threshold value and positional shift, since the disclosure is only focused on the positional shift on either edge.

SUMMARY

According to the present invention, there is provided a simulation method that provides, through simulation, information on a transfer pattern to be produced on a wafer upon transferring a predetermined mask pattern thereto by optical photolithography, comprising accepting an input of a measured dimension of the transfer pattern; calculating a light intensity at each of a plurality of positions; calculating a light intensity gradient at each of the positions based on the light intensity; multiplying the light intensity, a tentative optical reaction coefficient and the light intensity gradient to thus obtain a modified value, and adding such modified value to the light intensity thereby giving a modified light intensity;

and deciding a threshold value and the optical reaction coefficient by regression calculation such that a difference between the measured dimension and a calculated dimension becomes minimal under the modified light intensity, employing as a constant the threshold value of the light intensity at a pair of edges that define the calculated dimension of the transfer pattern in the simulation.

According to the present invention, there is also provided a simulation system that provides, through simulation, information on a transfer pattern to be produced on a wafer upon transferring a predetermined mask pattern thereto by optical photolithography, comprising a unit accepting an input of a measured dimension of the transfer pattern; a unit calculating a light intensity at each of a plurality of positions; a unit calculating a light intensity gradient at each of the positions based on the light intensity; a unit multiplying the light intensity, a tentative optical reaction coefficient and the light intensity gradient to thus obtain a modified value, and adding such modified value to the light intensity thereby giving a modified light intensity; and a unit deciding the threshold value and the optical reaction coefficient by regression calculation such that a difference between a calculated CD (calculated dimension) and the measured CD (measured dimension) becomes minimal under the modified light intensity, employing as a constant the threshold value of the light intensity at a pair of edges that define the calculated CD of the transfer pattern in the simulation.

The simulation method and the simulation system thus arranged are free from a calculation based on the threshold value associated with the light intensity gradient, and hence allow handling different positional shifts at two edges only based on the measured CD, despite that the mask includes both a symmetrical pattern and an asymmetric pattern. Such arrangement allows, therefore, eliminating the trouble of measuring the absolute coordinate of the edges and the need of incorporating the fixed point which imposes significant restriction on the designing freedom. Consequently, simply measuring the CD can lead to establishing the lithography model for the OPC, without the need of employing the edge coordinate of the photoresist resolution pattern after exposure, based on the absolute coordinate.

According to the present invention, there is provided a method of modifying a mask pattern, comprising utilizing a lithography model established through the foregoing simulation method, to thereby modify the mask pattern. The method thus arranged allows, because of utilizing the lithography model established through the foregoing simulation method, obtaining a desired transfer pattern with higher accuracy.

Thus, the present invention enables eliminating the trouble of measuring the absolute coordinate of the edge, and the need of incorporating the fixed point which imposes significant restriction on the layout design.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 20 is a diagram showing an important portion of the calculation process according to the second comparative example.

DETAILED DESCRIPTION

Figure 1:
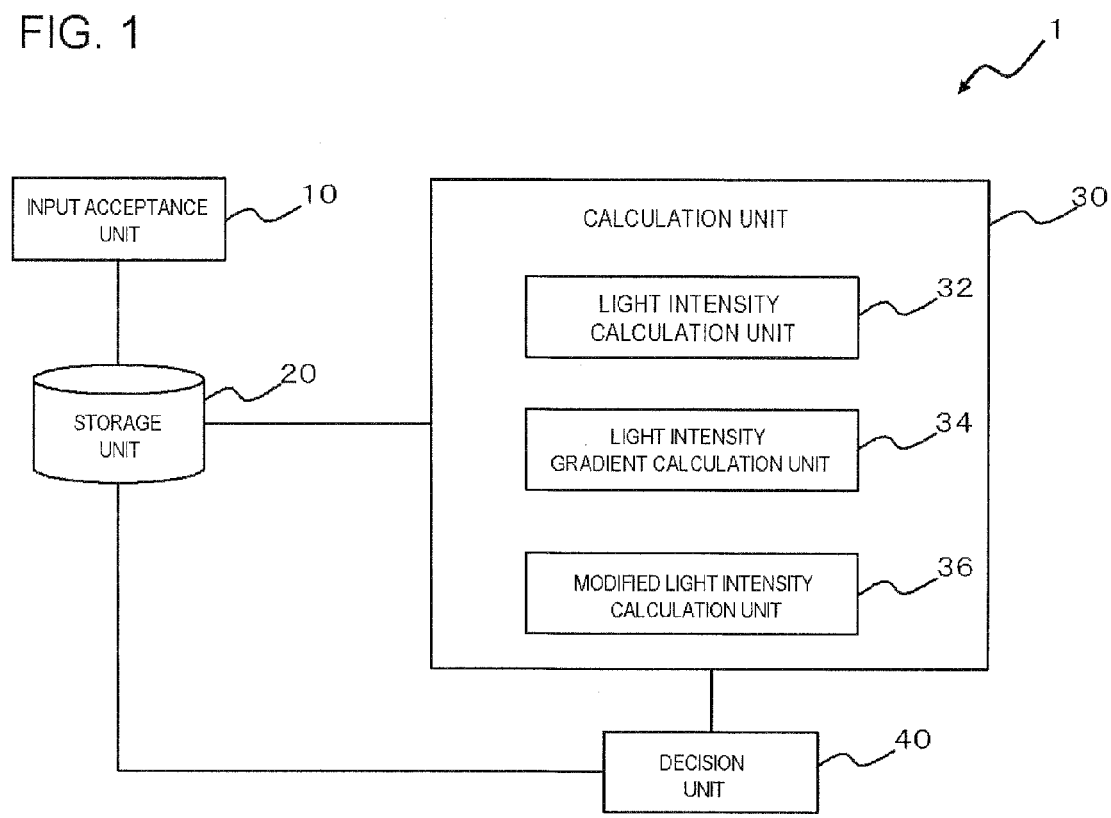
FIG. 1 is a block diagram showing a simulation system according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a simulation method, simulation system, and method of modifying a mask pattern according to the present invention will be described in details, referring to the accompanying drawings. In the drawings, same constituents are given the same numerals, and the description thereof will not be repeated.

First Embodiment

FIG. 1 is a block diagram showing a simulation system according to a first embodiment of the present invention. The simulation system 1 is a system that provides, through simulation, information on a transfer pattern of a predetermined mask pattern transferred to a wafer by optical photolithography, and includes an input acceptance unit 10, a storage unit 20, a calculation unit 30, and a decision unit 40.

The input acceptance unit 10 serves to accept an input of a measured CD of the transfer pattern. Examples of the input acceptance unit 10 include a keyboard and a mouse.

The storage unit 20 stores therein simulation parameters such as a measured CD input through the input acceptance unit 10. Examples of the storage unit 20 include memories such as a RAM and ROM. The storage unit 20 may also store a light intensity value and so forth, calculated by the calculation unit 30 described below.

The calculation unit 30 includes a light intensity calculation unit 32, a light intensity gradient calculation unit 34, and a modified light intensity calculation unit 36. Examples of the calculation unit 30 include a CPU.

The light intensity calculation unit 32 serves to calculate light intensity at each of a plurality of positions. The light intensity gradient calculation unit 34 serves to calculate light intensity gradient at each position, based on the light intensity. The modified light intensity calculation unit 36 serves to calculate a modified value including a product of the light intensity and a tentative optical reaction coefficient and to add the modified value to the light intensity, thereby calculating modified light intensity. In this embodiment, the product of the light intensity, the optical reaction coefficient, and the light intensity gradient is employed as the modified value.

The decision unit 40 serves to perform regression calculation such that a difference between the calculated CD and the measured CD becomes minimal under the modified light intensity, employing as a constant the threshold value of the light intensity at a pair of edges that define the calculated CD of the transfer pattern in the simulation, thereby deciding the threshold value and the optical reaction coefficient. Examples of the decision unit 40 include a CPU.

Hereunder, an operation of the simulation system 1 will be described as a first embodiment of the simulation method according to the present invention. An outline of the operation will be first described.

As already stated, it is experientially known that the threshold value depends on the light intensity gradient, i.e. varies depends on the location. This phenomenon is, however, inexplicable upon reminding the principle of the lithography simulation, specifically the principle of introducing the threshold value in the light intensity with the reasoning that the quantity of the photochemically reacted molecules is proportionate to the light intensity.

Assuming at this point that the light intensity value given by calculation is not erroneous, and that it is an unchanging principle that a photoresist dissolves in a developing solution at a region where the quantity of the photochemically reacted molecules has exceeded a fixed threshold value with respect to the initial total quantity of the molecules, leads to a conclusion that what is wrong is the assumption that the quantity of the photochemically reacted molecules is simply proportionate to the light intensity. Actually, no other photochemical reaction than those that progress in proportion to the light intensity, have been observed so far. Latest studies have revealed, however, that a reaction different from the conventionally known photochemical reaction takes place in a region where the light intensity varies in a range of nanometer level close to a molecule size, in other words where the light intensity gradient is steep in a range of nanometer level (Optical Micrography XV, Proceedings of SPIE Vol. 4691(2002), pp. 377-394, J. Chem. Phy., Vol. 122, 024715 (2005), 2006 Spring Meeting, The Japan Society of Applied Physics, 25a-ZB-2 and 2006 Spring Meeting, The Japan Society of Applied Physics, 25a-ZB-3).

The non-patented documents (Optical Micrography XV, Proceedings of SPIE Vol. 4691(2002), pp. 377-394, J. Chem. Phy., Vol. 122, 024715 (2005), 2006 Spring Meeting, The Japan Society of Applied Physics, 25a-ZB-2 and 2006 Spring Meeting, The Japan Society of Applied Physics, 25a-ZB-3) state that employing a light of a non-photosensitizing wavelength, which is longer (i.e. of lower energy) than a photosensitizing wavelength enables the exposure in a region where the light intensity gradient is steep in the nanometer level range, by nonadiabatic photochemical reaction, though normally the exposure cannot take place in such a region, and that therefore employing the light of a non-photosensitizing wavelength and properly arranging the locations where the light intensity gradient is steep in the nanometer level range leads to obtaining a desired resolution pattern.

Thus, assuming that, even in an ordinary photoresist exposure in which a normal photosensitizing light is employed, the photochemical reaction latently or secondarily takes place in a region where the light intensity gradient is steep in the nanometer level range reassures that the calculated light intensity value is not erroneous, and reaffirms the principle that a photoresist dissolves in a developing solution at a region where the quantity of the photochemically reacted molecules has exceeded a fixed threshold value with respect to the initial total quantity of the molecules.

The difficulty in this case lies in that the ordinary exposure process in which the photochemical reaction progresses simply in proportion to the light intensity, and the foregoing photochemical reaction in the region where the light intensity gradient is steep in the nanometer level range, which takes place in proportion to the product of the light intensity and the light intensity gradient, take place simultaneously and are hence inseparable, and the ratio of the respective photochemical reaction is therefore unknown.

Accordingly, the photochemical reaction in the region where the light intensity gradient is steep in the nanometer level range will be incorporated in the lithography simulation as specified below.

Firstly, light intensity I(x, y) at a position (x, y) is calculated, and a slope (x, y) representing the light intensity gradient is calculated with the following equation:

$$\text{slope}(x,y) = [\{(\partial/\partial x)I(x,y)\}2 + \{(\partial/\partial y)I(x,y)\}2]^{1/2} \quad (1)$$

A modified light intensity Im(x, y), to be obtained upon regarding the photochemical reaction in the region where the light intensity gradient is steep in the nanometer level range as being the same as the ordinary photochemical reaction, is defined as follows, although the actual light intensity is unchanged:

$$Im(x,y) = I(x,y) + \text{coef}*I(x,y)*\text{slope}(x,y) \quad (2)$$

In the equation (2), coef represents the ratio of the photochemical reaction in the region where the light intensity gradient is steep in the nanometer level range with respect to the ordinary photochemical reaction (optical reaction coefficient). The coef is regarded as a unit of length as x and y, thus to match the dimension of the equation. Also, the coef is treated as an undetermined constant, since the accurate value of the coef is unknown.

On the other hand, the threshold value is also treated as an undetermined constant α, which is independent from x and y. Like the case of obtaining the same CD value as the measured CD through calculation, treating the coef as a constant determined based on combined values like the optical parameter, and optimally obtaining the threshold value by regression calculation or a statistic process can expediently solve the problem that the coef is unknown.

Figure 3:
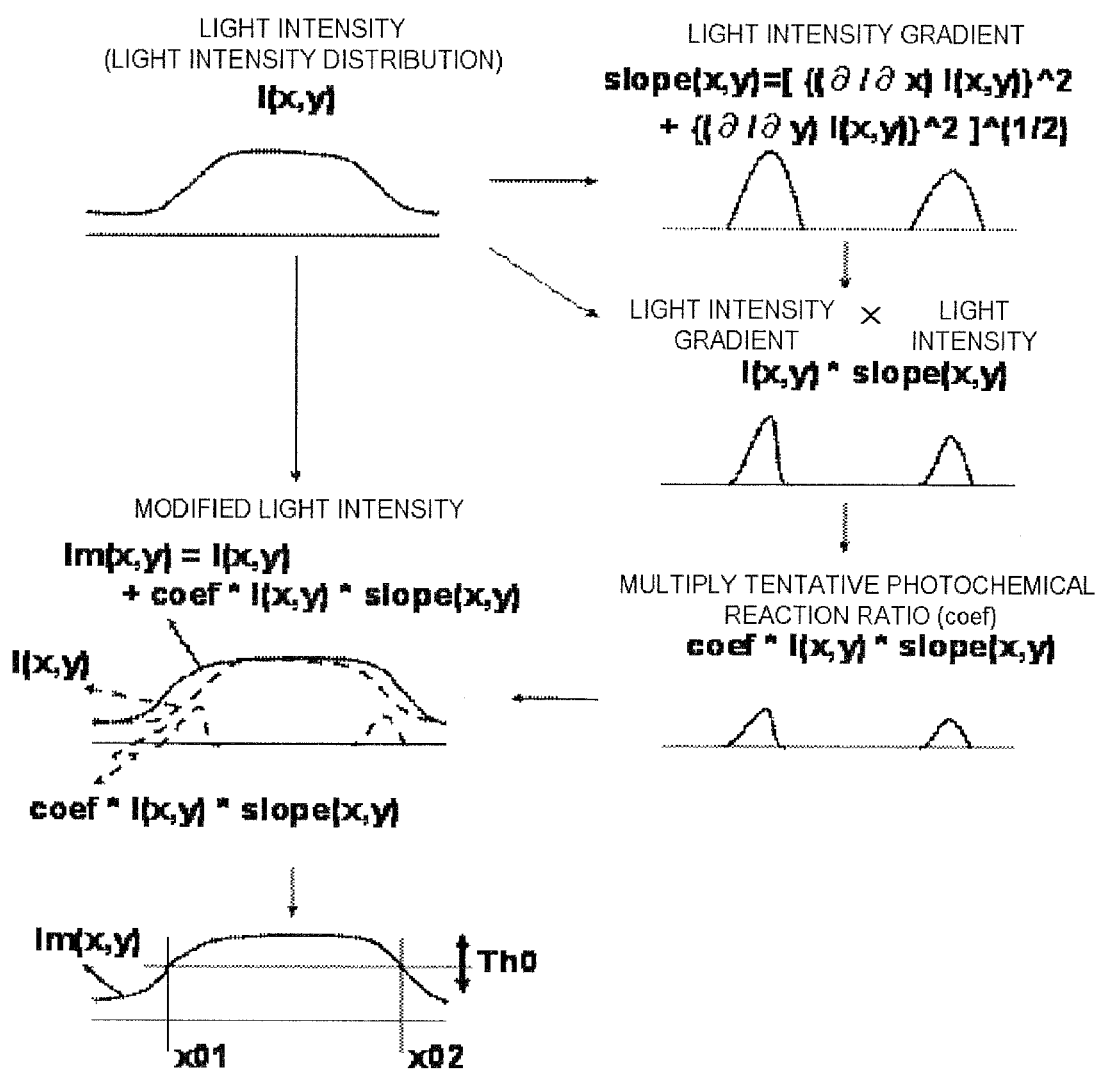
FIG. 3 is a diagram showing an important portion of the calculation process according to the first embodiment.

The foregoing concept will be explained referring to FIG. 3.

(A) The design value (mask CD) and the measured value (measured CD) are known.

(B) In the lithography simulation the light intensity distribution is given through calculation, and so is the light intensity gradient. Accordingly, the product of the light intensity distribution and the light intensity gradient can also be obtained.

(C) Tentatively determining the coef allows obtaining the light intensity after modification.

(D) The threshold value that defines the pattern edge will be represented by an undetermined constant α which is a fixed value.

(E) Now that the light intensity after modification is given and the threshold values at the respective ends that define the calculated values (calculated CD) are equal, giving various values to the threshold value leads to uniquely determining the value that makes the calculated value (calculated CD) and the measured value (measured CD) agree with each other. In this case, the calculation can be made irrespective of whether the region where the CD is calculated is symmetrical or asymmetric.

(F) By regression calculation, the lithography model is determined based on the condition that makes the difference between the calculated value (calculated CD) and the measured value (measured CD) minimal. At this stage, the ratio of the photochemical reaction (coef) and the threshold value (α), which have so far been undetermined constants, are also determined.

Figure 2:
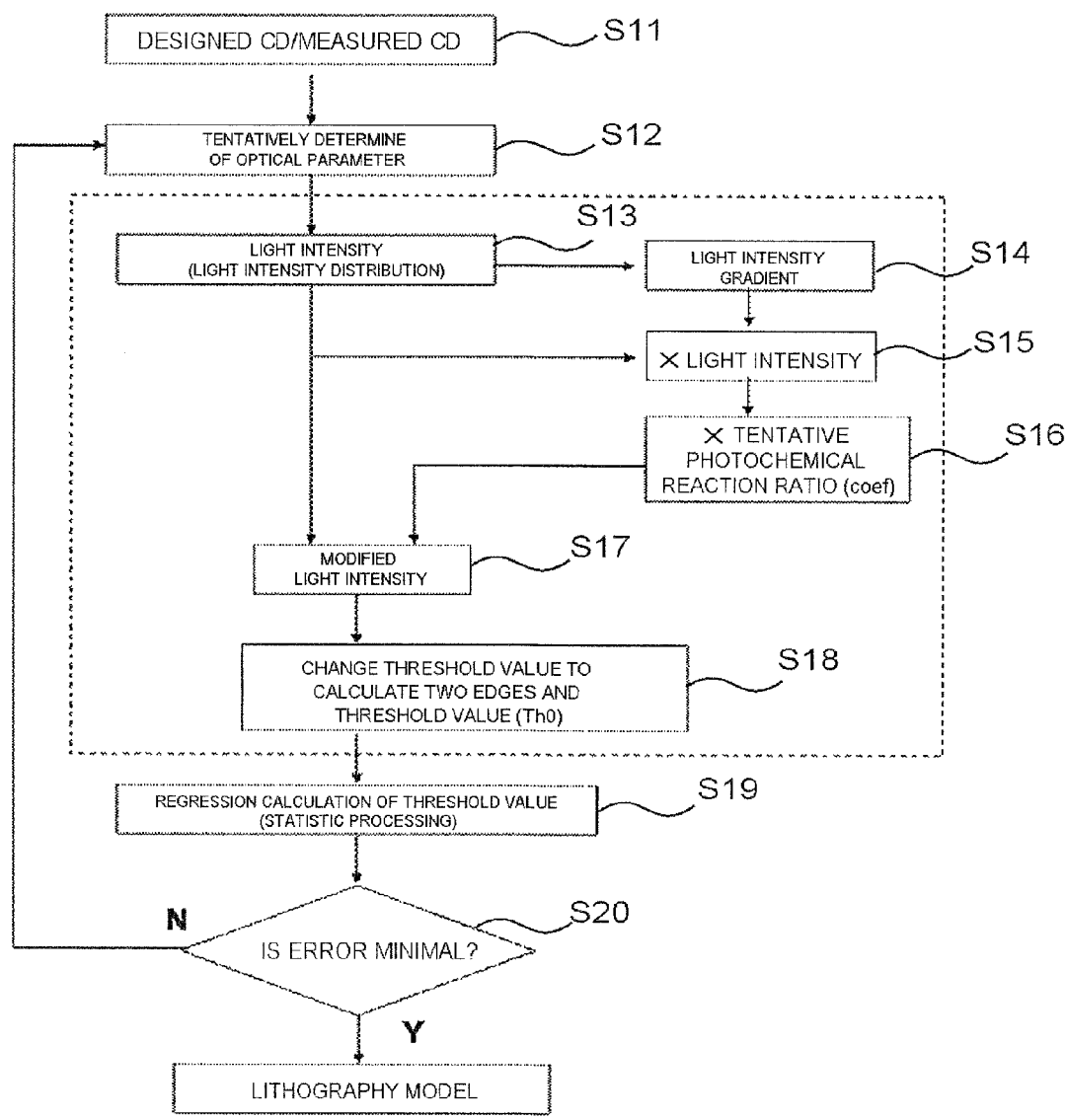
FIG. 2 is a flowchart showing a calculation process according to the first embodiment.

Further referring to FIG. 2 showing the flowchart of the operation, and to FIG. 3 regarding the important portion of the calculation process (enclosed by dotted lines in FIG. 2), details of the operation of the simulation system 1 will be described. In the lithography simulation, the following steps (a) to (j) are executed.

(a) The designed value (designed CD) and the measured value (measured CD) are provided (S11).

(b) The optical parameter is tentatively determined (S12).

(c) The light intensity I(x, y) at the position (x, y) is calculated (S13).

(d) Based on partial differentiation at (x, y), the light intensity gradient (slope (x, y)) is calculated through the following equation (S14):

$$\mathrm{slope}(x,y) = [\{(\partial/\partial x)I(x,y)\}^2 + \{(\partial/\partial y)I(x,y)\}^2]^{1/2} \quad (3)$$

(e) The light intensity gradient and the light intensity are multiplied as follows (S15):

$$I(x,y) * \mathrm{slope}(x,y) \quad (4)$$

(f) The optical reaction coefficient coef is tentatively given, so that a light intensity signal corresponding to the photochemical reaction in the region where the light intensity gradient is steep in the nanometer level range is given as the following formula (S16):

$$\mathrm{coef} * I(x,y) * \mathrm{slope}(x,y) \quad (5)$$

(g) Adding the light intensity signal corresponding to the photochemical reaction in the region where the light intensity gradient is steep in the nanometer level range to the initial light intensity leads to obtaining the modified light intensity signal as follows (S17):

$$Im(x,y) = I(x,y) + \mathrm{coef} * I(x,y) * \mathrm{slope}(x,y) \quad (6)$$

(h) Giving various values to the threshold value under the modified light intensity signal Im(x, y) leads to obtention of two edges x01 (strictly, (x01, y00)) and x02 (strictly, (x02, y00)) where the measured CD agree with the calculated value CD, as well as the threshold value Th0 that is equal at the two edges (S18).

(i) The threshold value thus obtained is applied to the regression calculation (statistic processing) (S19).

(j) Once the condition that makes the difference between the calculated value (calculated CD) and the measured value (measured CD) minimal is satisfied, the optical parameter, the optical reaction coefficient (coef), and the threshold value which have so far been undetermined constants are determined, thus completing the lithography model. If the condition is not satisfied, different values are given to the optical parameter and the photochemical reaction ratio (coef), until the condition is satisfied (S20). The coefficient (coef) may be in a range of 0.02 to 0.2 [μm] for example, when the intensity is substituted with a dimensionless value. Upon practically executing this embodiment, the regression calculation was converged when the coefficient (coef) was within such range.

Here, a first embodiment of the method of modifying the mask pattern according to the present invention represents the case of modifying the foregoing mask pattern utilizing the lithography model established by the simulation method according to this embodiment.

This embodiment provides the following advantageous effects. As stated above, this embodiment allows obtaining amounts of positional shift that are different between two locations, only from the measured CD even in the case of an asymmetric pattern, as conventionally done with respect to the symmetrical pattern because it is free from a calculation based on the threshold value associated with the light intensity gradient. Such arrangement eliminates the need of measuring the absolute coordinate of the edge, and incorporating the fixed point that imposes significant restriction on the designing freedom. Also, handling the threshold value as a fixed value suppresses an increase in time required for performing the conventional complicated threshold value calculation depending on the light intensity.

Further, the method of modifying a mask pattern according to this embodiment employs the lithography model established through the foregoing simulation method. The method thus arranged allows obtaining a desired transfer pattern with higher accuracy.

Figure 17:
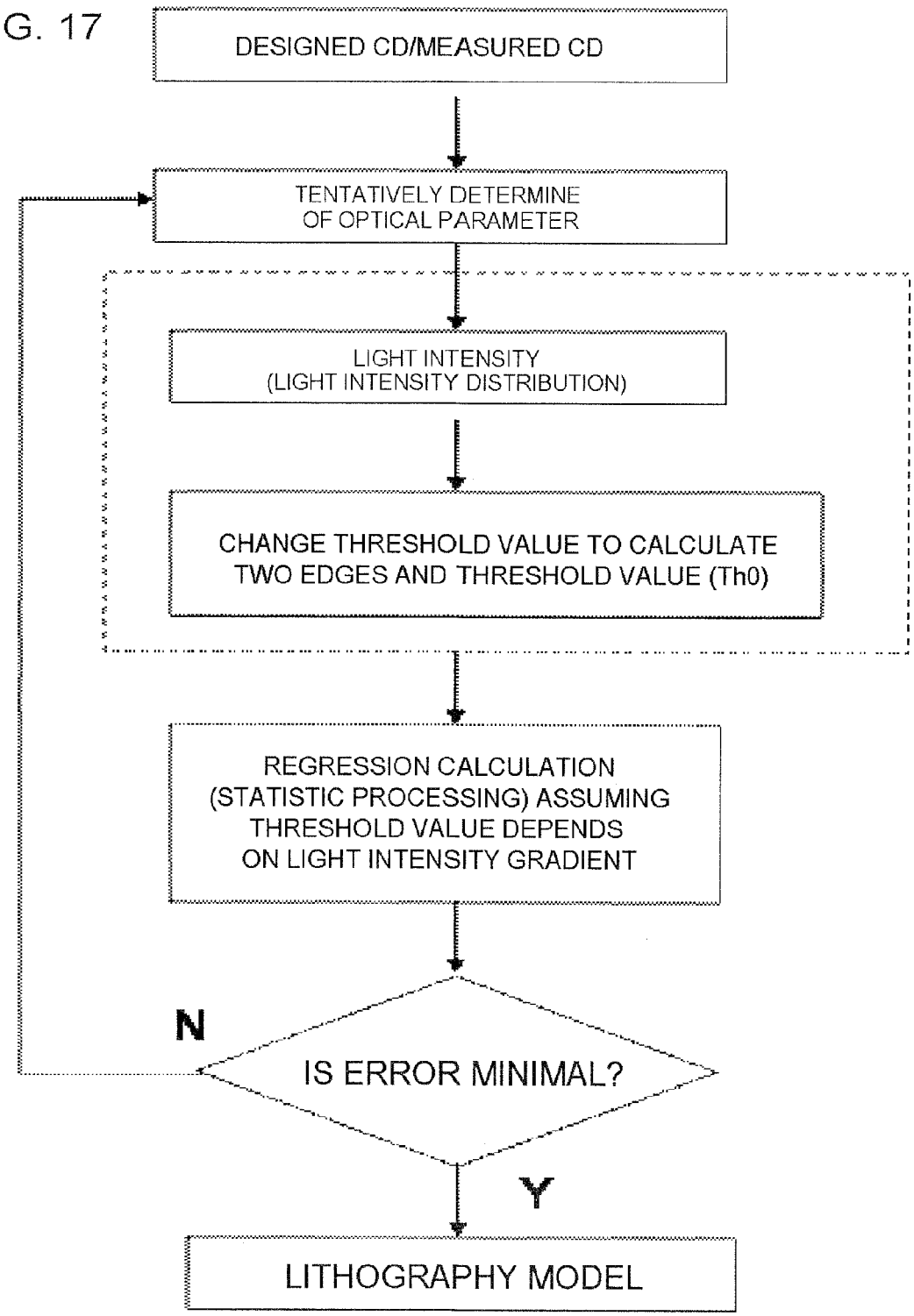
FIG. 17 is a flowchart showing a calculation process according to a first comparative example.
Figure 18:
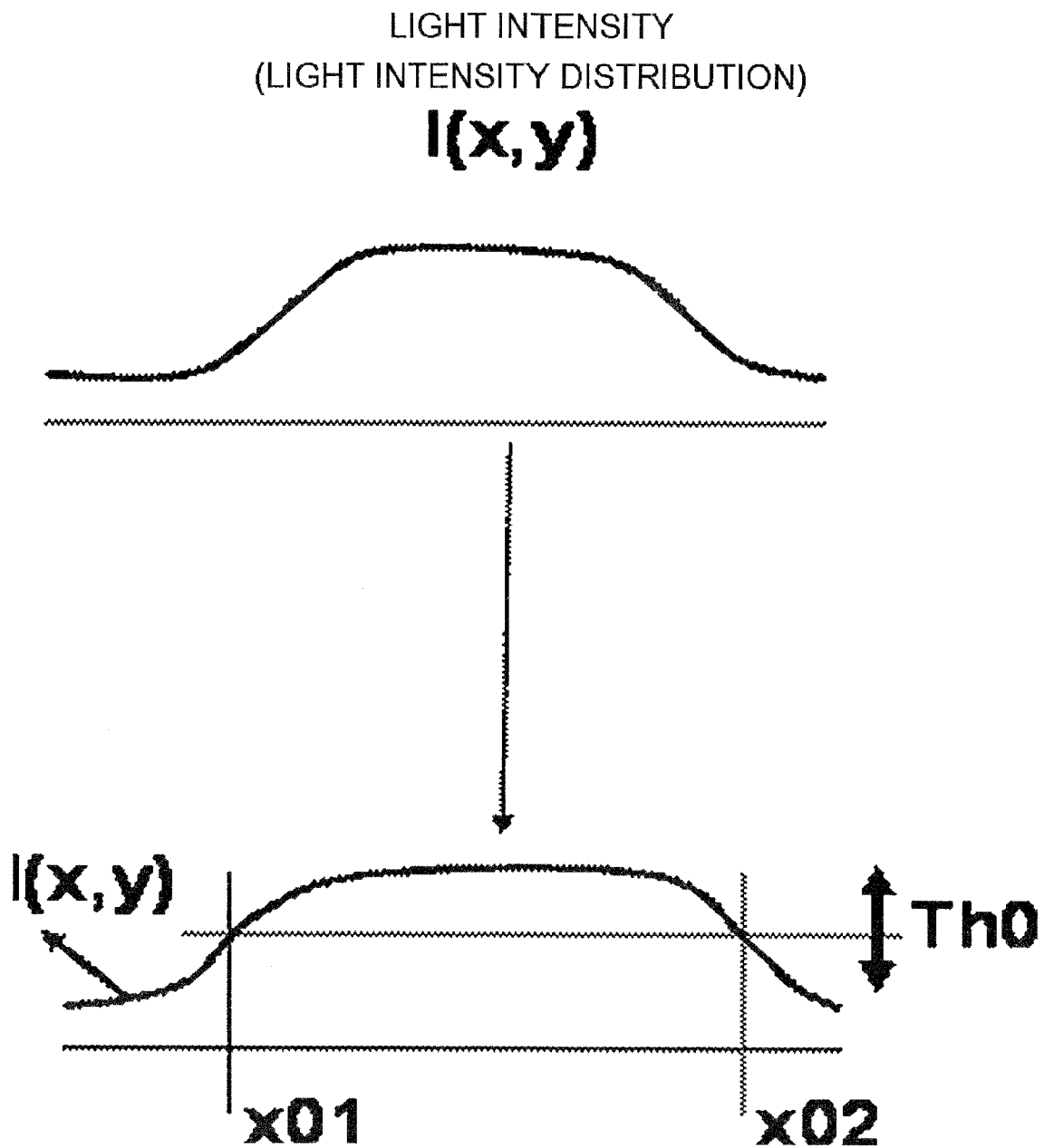
FIG. 18 is a diagram showing an important portion of the calculation process according to the first comparative example.

FIG. 17 is a flowchart showing a calculation process according to a first comparative example. FIG. 18 is a diagram showing an important portion of the calculation process according to the first comparative example (enclosed by dotted lines in FIG. 17). The foregoing embodiment is different from this comparative example in employing the modified light intensity, obtained by adding the light intensity corresponding to the photochemical reaction in the region where the light intensity gradient is steep in the nanometer level range, instead of the conventional light intensity used in the comparative example.

Second Embodiment

The simulation system and simulation method according to a second embodiment of the present invention will be described hereunder. The block diagram of the simulation system according to the second embodiment is similar to that of the first embodiment (Ref. FIG. 1).

The second embodiment is different from the first embodiment in the function of the modified light intensity calculation unit 36 and the decision unit 40. In this embodiment, the modified light intensity calculation unit 36 calculates the modified light intensity through convolution integration of the sum of the light intensity and the modified value, and a Gaussian function having a tentative diffusion length. The decision unit 40 also determines the diffusion length, in addition to the threshold value and the optical reaction coefficient.

Figure 4:
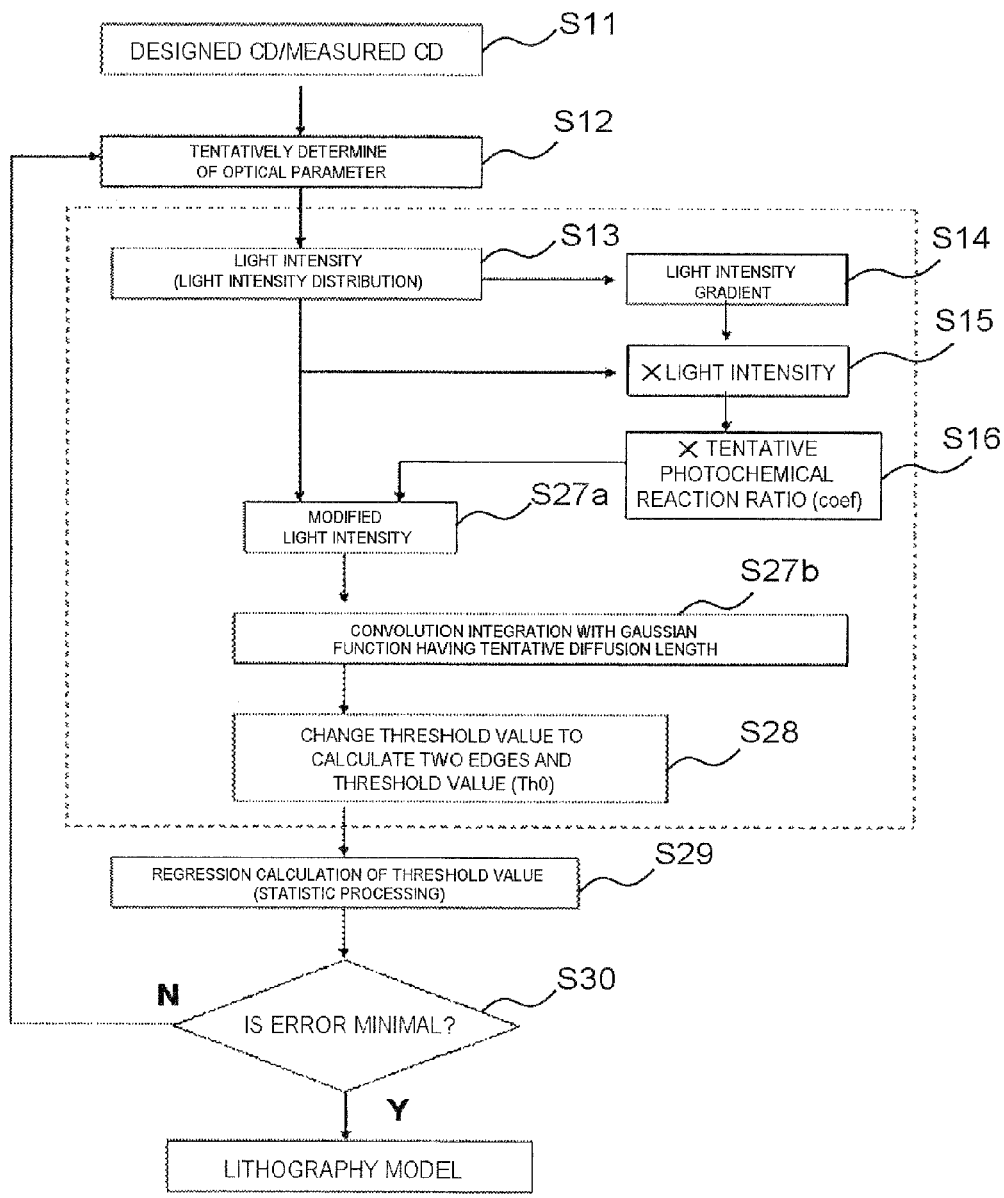
FIG. 4 is a flowchart showing a calculation process according to a second embodiment of the present invention.
Figure 5:
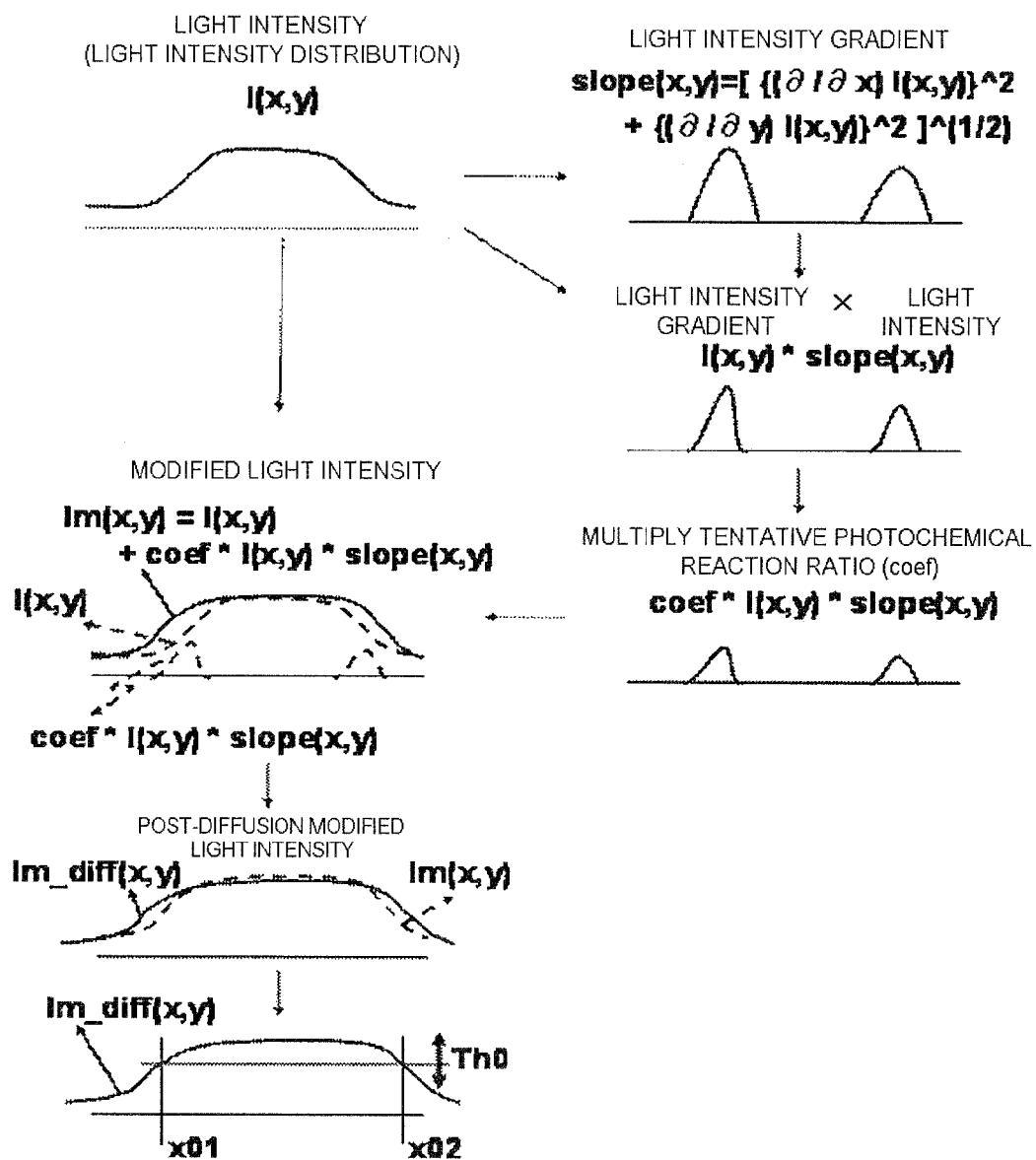
FIG. 5 is a diagram showing an important portion of the calculation process according to the second embodiment.

Details of the operation will now be described, referring to FIG. 4 showing the flowchart of the operation, and to FIG. 5 regarding the important portion of the calculation process (enclosed by dotted lines in FIG. 4). The steps S11 to S16 are generally the same as in the first embodiment (Ref. FIG. 2), and hence the description thereof will not be repeated.

After the step S16, the modified light intensity signal Im(x, y) is calculated as in the first embodiment (S27a). In the lithography process, the molecule distribution after the photochemical reaction is proportional to the light intensity distribution, and the photochemically reacted molecules (for example, hydrogen ion) are diffused by heat through a postbake process. To incorporate the molecule diffusion effect produced by the post-bake process applied to the photoresist, a value obtained through convolution integration of Im(x, y) with at least one of the Gaussian functions having a tentative diffusion length is determined as a post-diffusion modified light intensity Im_diff(x, y) (S27b). In the subsequent steps, the post-diffusion modified light intensity (Im_diff(x, y)) is treated as the "modified light intensity signal".

Giving various values to the threshold value under the modified light intensity signal (Im_diff(x, y)) leads to obtention of two edges x01 (strictly, (x01, y00)) and x02 (strictly, (x02, y00)) where the measured CD agree with the calculated value CD, as well as the threshold value Th0 that is equal at the two edges (S28).

The threshold value thus obtained is then applied to the regression calculation (statistic processing) (S29). Once the condition that makes the difference between the calculated value (calculated CD) and the measured value (measured CD) minimal is satisfied, the optical parameter, the optical reaction coefficient (coef), the diffusion length and the threshold value which have so far been undetermined constants are determined, thus completing the lithography model. If the condition is not satisfied, different values are given to the optical parameter, the photochemical reaction ratio (coef), and the diffusion length until the condition is satisfied (S30). The coefficient (coef) may be in a range of 0.02 to 0.2 [μm] for example, as in the first embodiment. Also, the diffusion length may be in a range of 0.0 to 0.05 [μm], though varying depending on the post-bake condition. Upon practically executing this embodiment, the regression calculation was converged when the coefficient (coef) and the diffusion length were within such range.

Here, a second embodiment of the method of modifying the mask pattern according to the present invention represents the case of modifying the foregoing mask pattern utilizing the lithography model established by the simulation method according to this embodiment.

This embodiment incorporates the influence of the post-bake process performed after the exposure for heating the photoresist. Such arrangement allows executing the empirical lithography simulation with higher accuracy than the first embodiment. Other advantageous effects of this embodiment are generally the same as those offered by the first embodiment.

Figure 19:
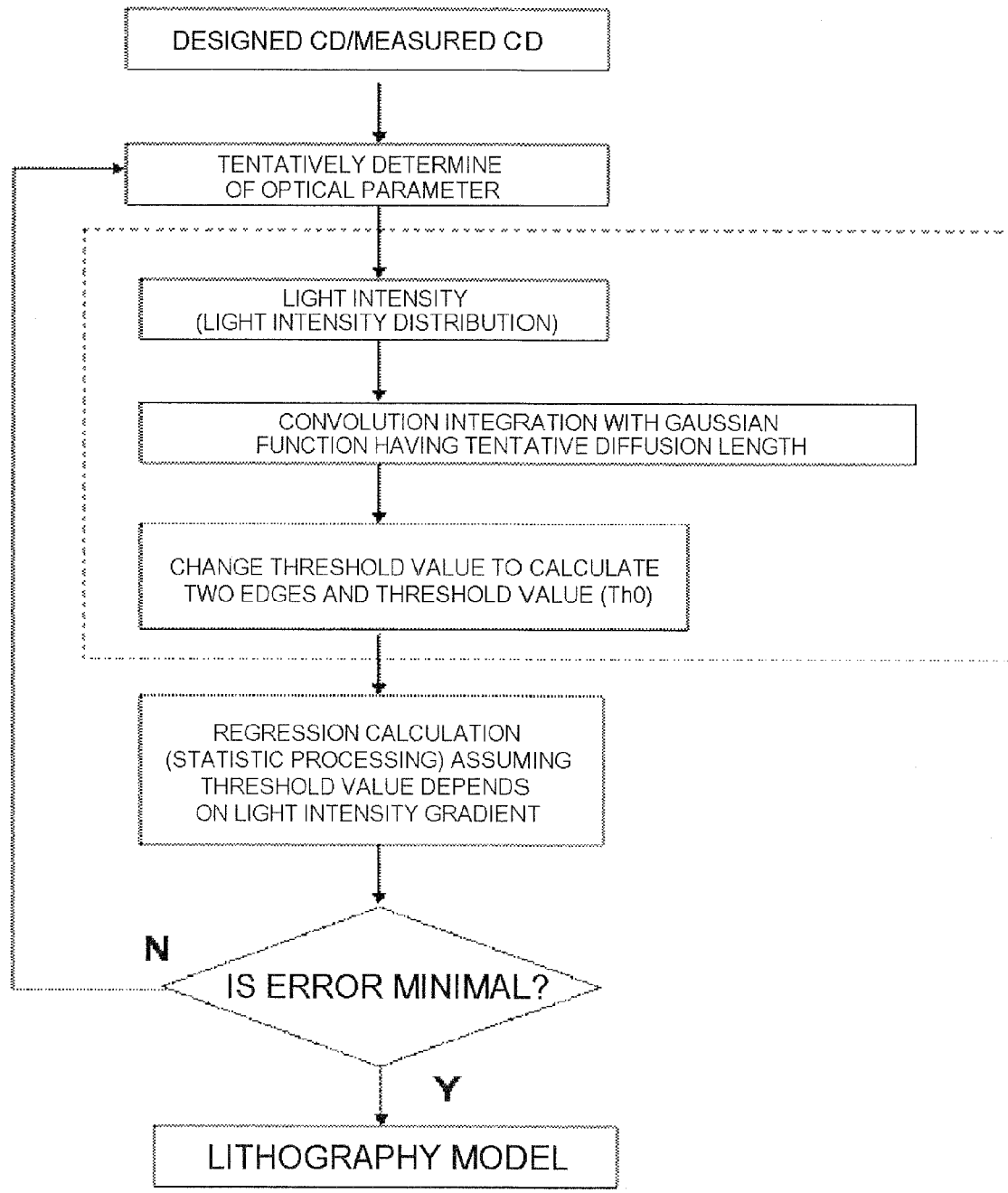
FIG. 19 is a flowchart showing a calculation process according to a second comparative example.

FIG. 19 is a flowchart showing a calculation process according to a first comparative example. FIG. 20 is a diagram showing an important portion of the calculation process according to the first comparative example (enclosed by dotted lines in FIG. 19). The foregoing embodiment is different from this comparative example in substituting the conventional light intensity with the modified light intensity, obtained by adding the light intensity corresponding to the photochemical reaction in the region where the light intensity gradient is steep in the nanometer level range.

Third Embodiment

Figure 6:
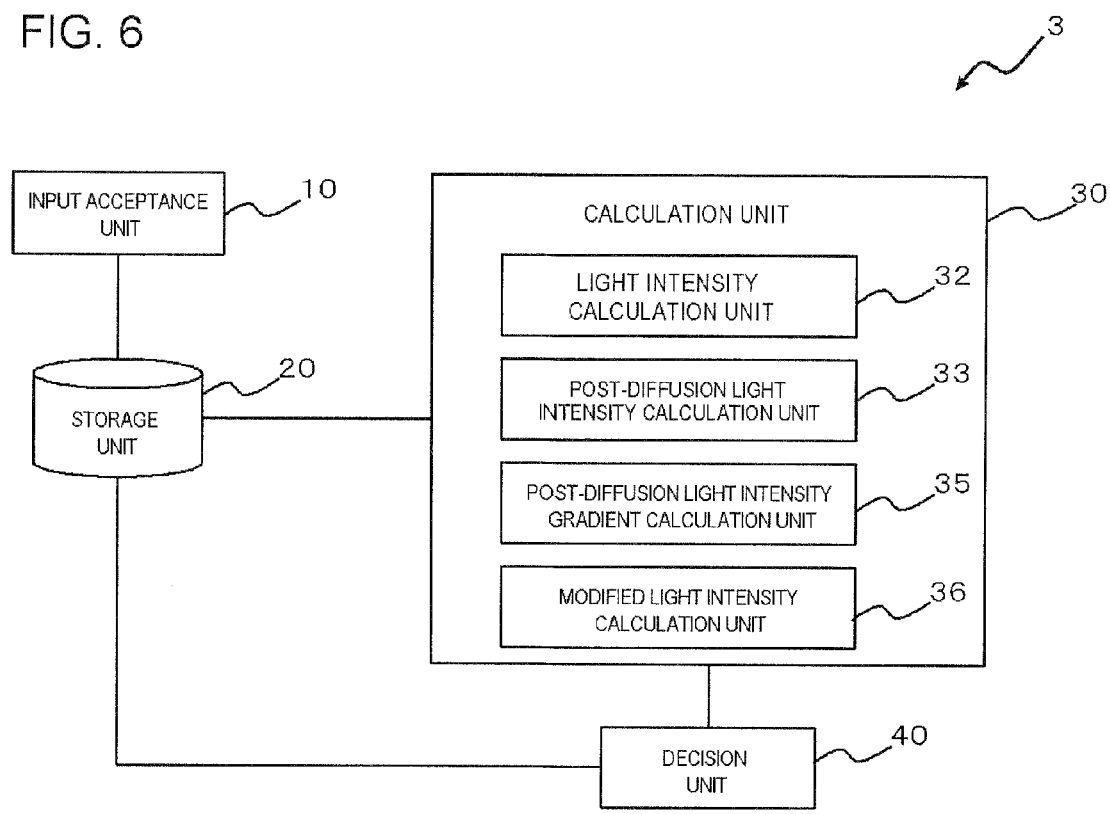
FIG. 6 is a block diagram showing a simulation system according to a third embodiment of the present invention.

FIG. 6 is a block diagram showing a simulation system according to a third embodiment of the present invention. The simulation system 3 is a system that provides, through simulation, information on a transfer pattern of a predetermined mask pattern transferred to a wafer by optical photolithography, and includes an input acceptance unit 10, a storage unit 20, a calculation unit 30, and a decision unit 40. The structure of the input acceptance unit 10 and the storage unit 20 is generally the same as that in the first embodiment.

In this embodiment, the calculation unit 30 includes a light intensity calculation unit 32, a post-diffusion light intensity calculation unit 33, a post-diffusion light intensity gradient calculation unit 35, and a modified light intensity calculation unit 36.

The post-diffusion light intensity calculation unit 33 serves to calculate a post-diffusion light intensity through convolution integration of the light intensity calculated by the light intensity calculation unit 32 and a Gaussian function having a tentative diffusion length. The post-diffusion light intensity gradient calculation unit 35 serves to calculate a post-diffusion light intensity gradient at each position based on the post-diffusion light intensity.

In this embodiment, the modified light intensity calculation unit 36 multiplies the post-diffusion light intensity, the optical reaction coefficient and the post-diffusion light intensity gradient to obtain a modified value, and adds such value to the post-diffusion light intensity, thereby giving the modified light intensity. The decision unit 40 serves to decide also the diffusion length, in addition to the threshold value and the optical reaction coefficient.

Figure 7:
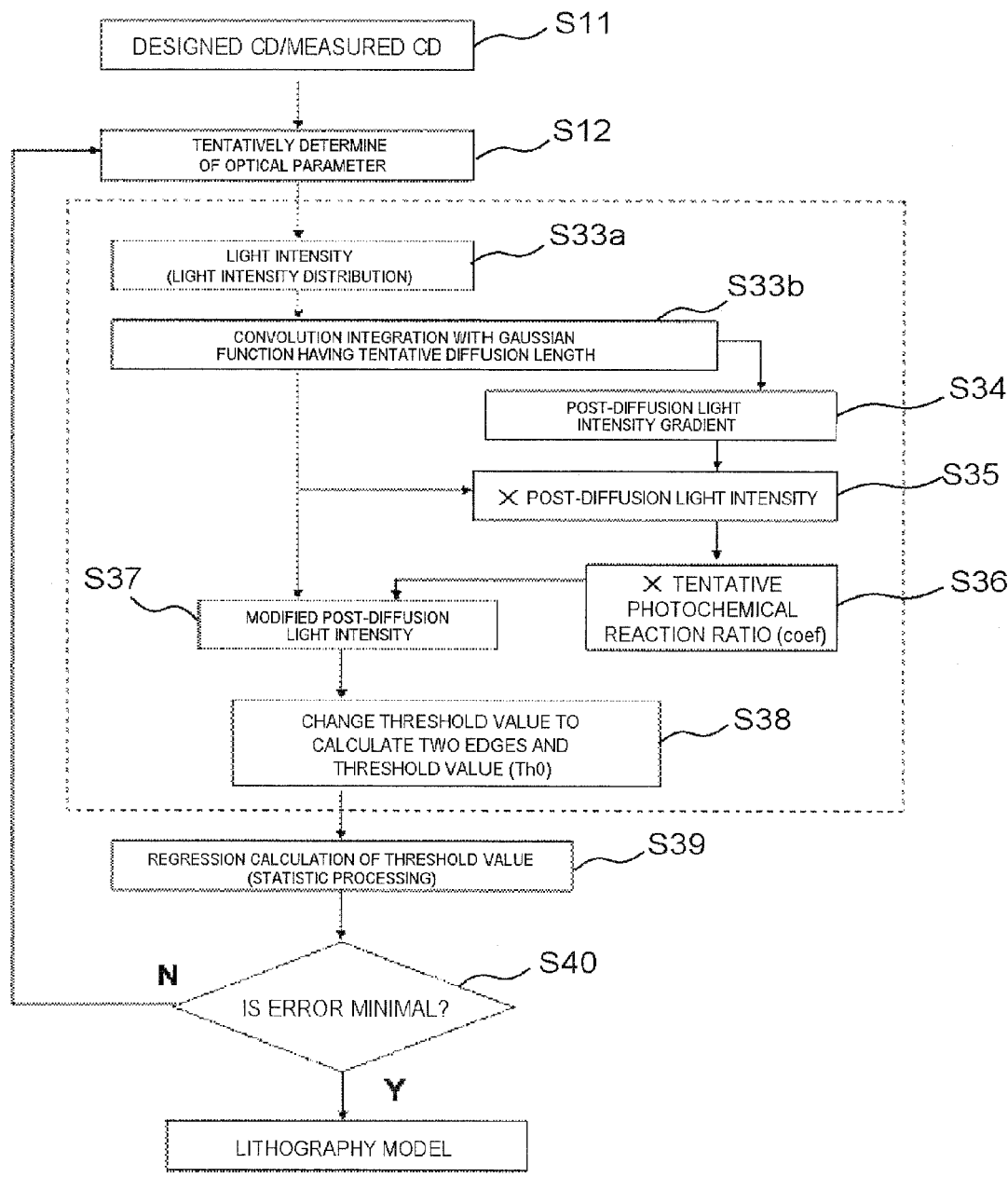
FIG. 7 is a flowchart showing a calculation process according to the third embodiment.
Figure 8:
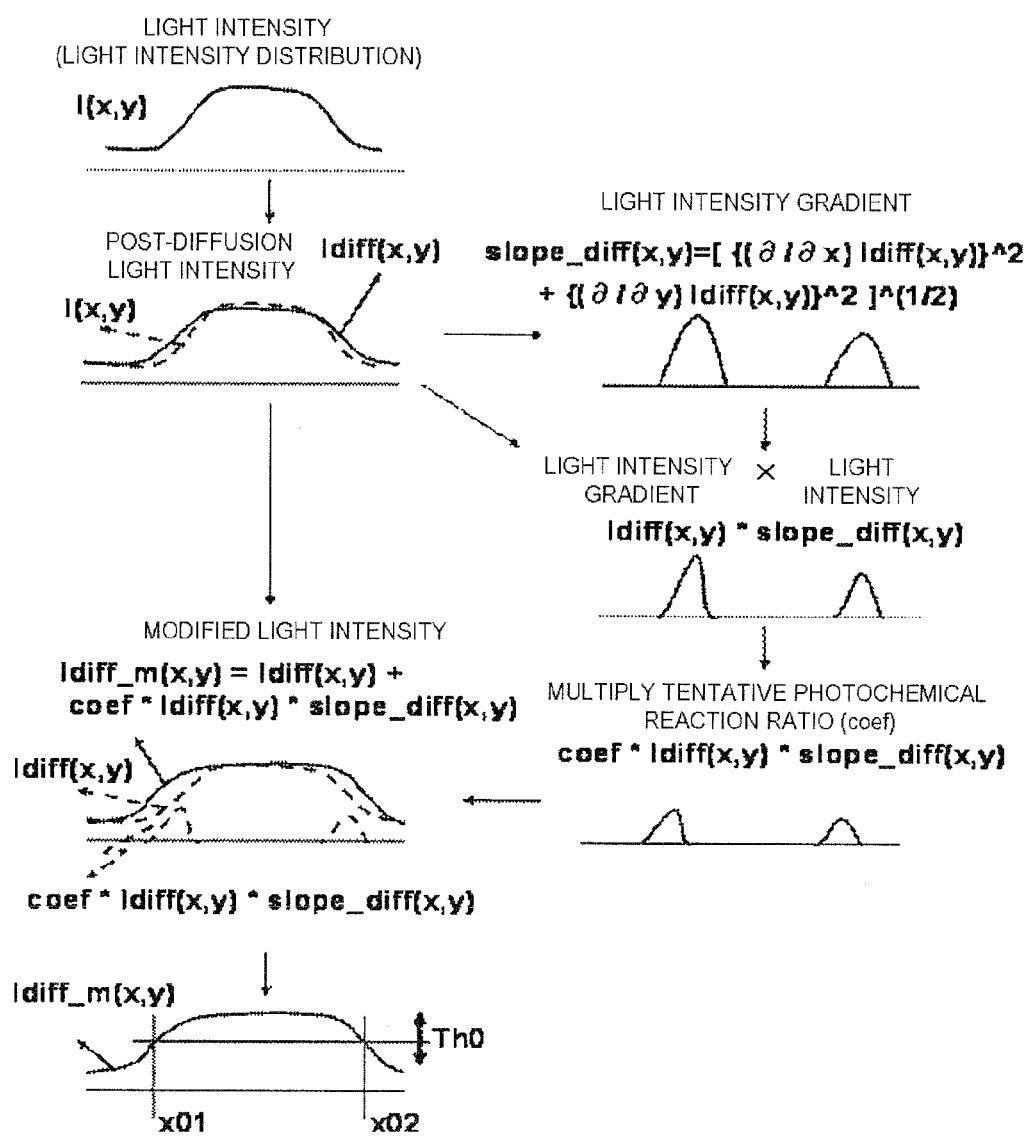
FIG. 8 is a diagram showing an important portion of the calculation process according to the third embodiment.
Figure 9:
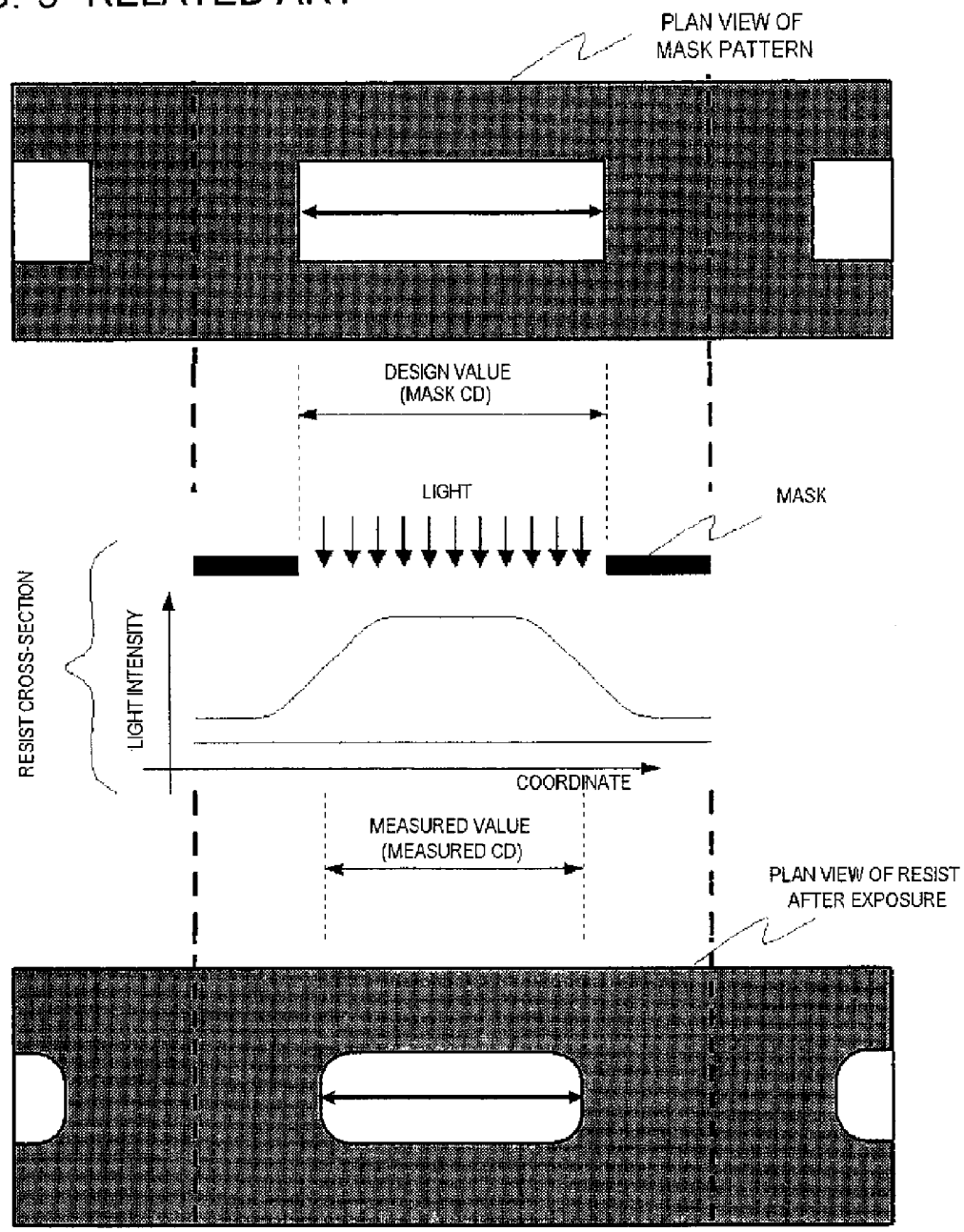
FIG. 9 includes, from the top, a plan view showing a mask pattern, a cross-sectional view of a photoresist on a wafer and a diagram showing a light intensity distribution in a lithography simulation, and another planview showing a resolution pattern of the photoresist after exposure, thereby showing a relationship among the respective states in a symmetrical pattern.
Figure 10:
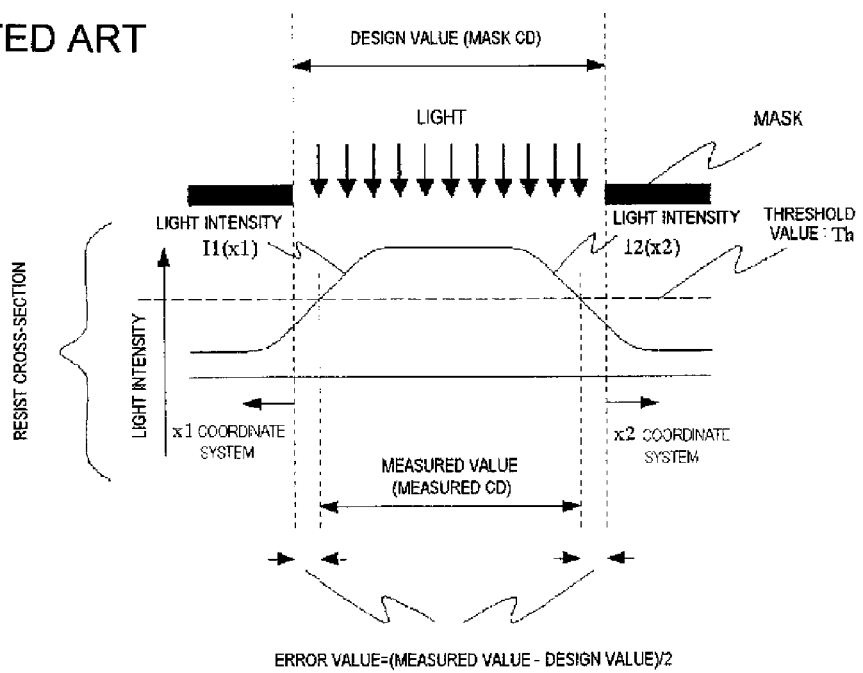
FIG. 10 is a diagram showing a relationship among a strength distribution on a cross-section of the resist, a design value (mask CD), a measured value (measured CD), and an error value, in the lithography simulation of the symmetrical pattern.
Figure 11:
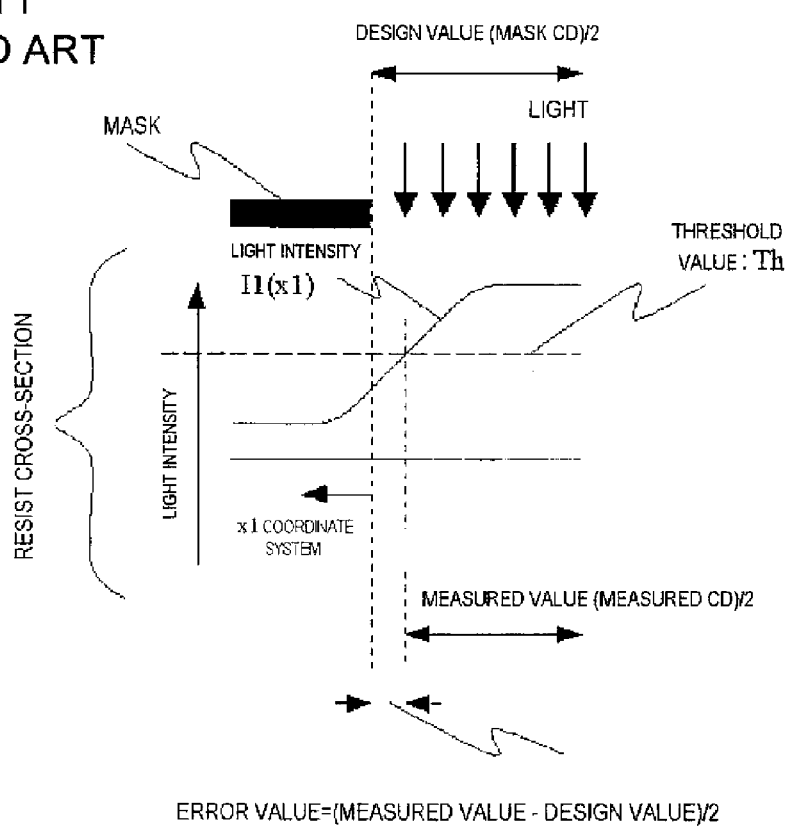
FIG. 11 is a diagram showing that the threshold value is obtainable from a half of the pattern, in the case of the symmetrical pattern.
Figure 12:
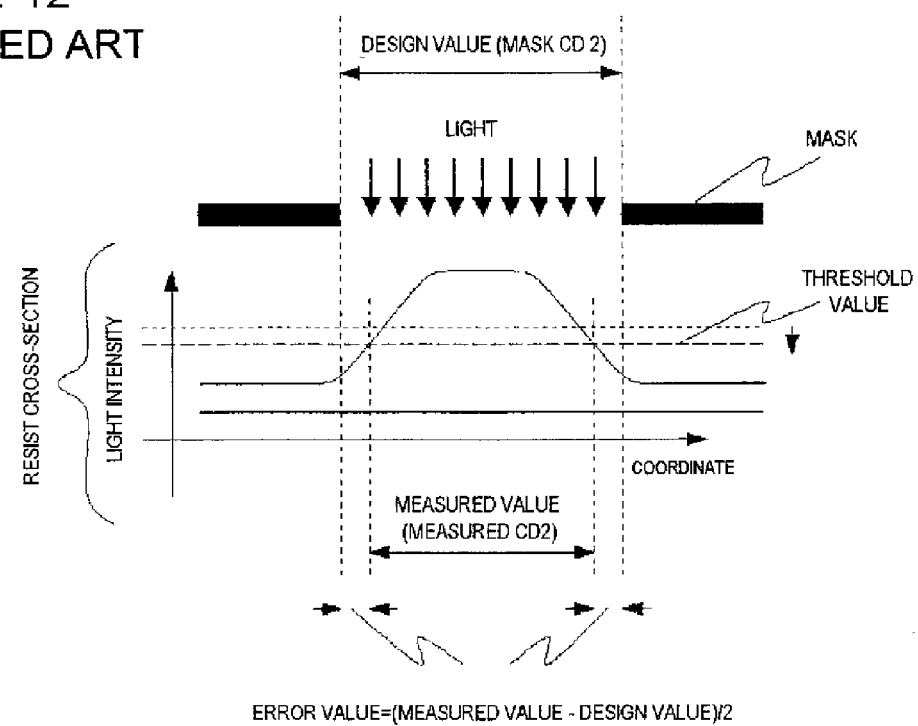
FIG. 12 is a diagram showing that the smaller design value (mask CD) provides the lower threshold value.
Figure 13:
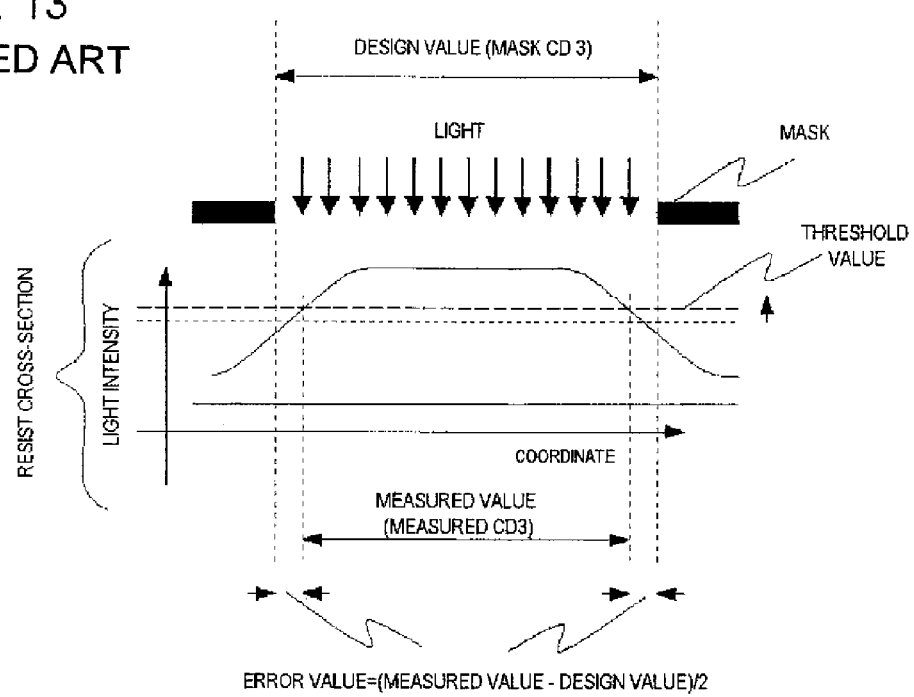
FIG. 13 is a diagram showing that the greater design value (mask CD) provides the higher threshold value.
Figure 14:
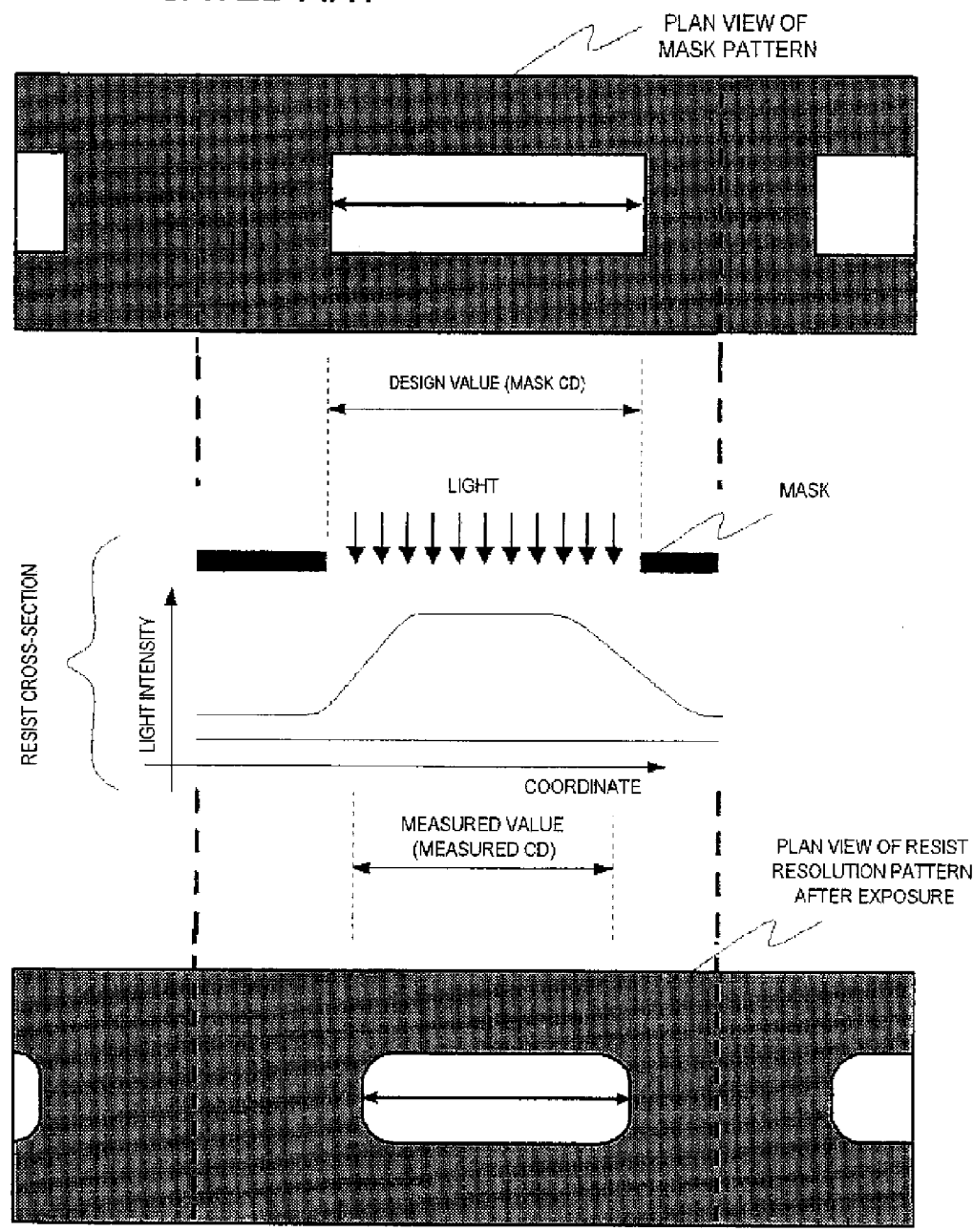
FIG. 14 includes, from the top, a plan view showing a mask pattern, a cross-sectional view of a photoresist on a wafer and a diagram showing a light intensity distribution in a lithography simulation, and another plan view showing a resolution pattern of the photoresist after exposure, thereby showing a relationship among the respective states in an asymmetric pattern.
Figure 15:
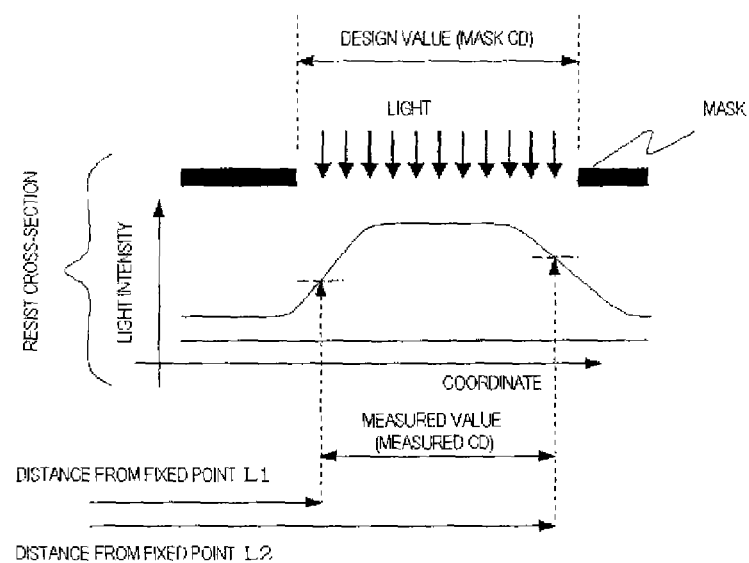
FIG. 15 is a diagram showing that, in the case of the asymmetric pattern, the edge coordinate of the measured CD can be obtained from a distance from a fixed point, and the threshold value on that coordinate can be determined.
Figure 16:
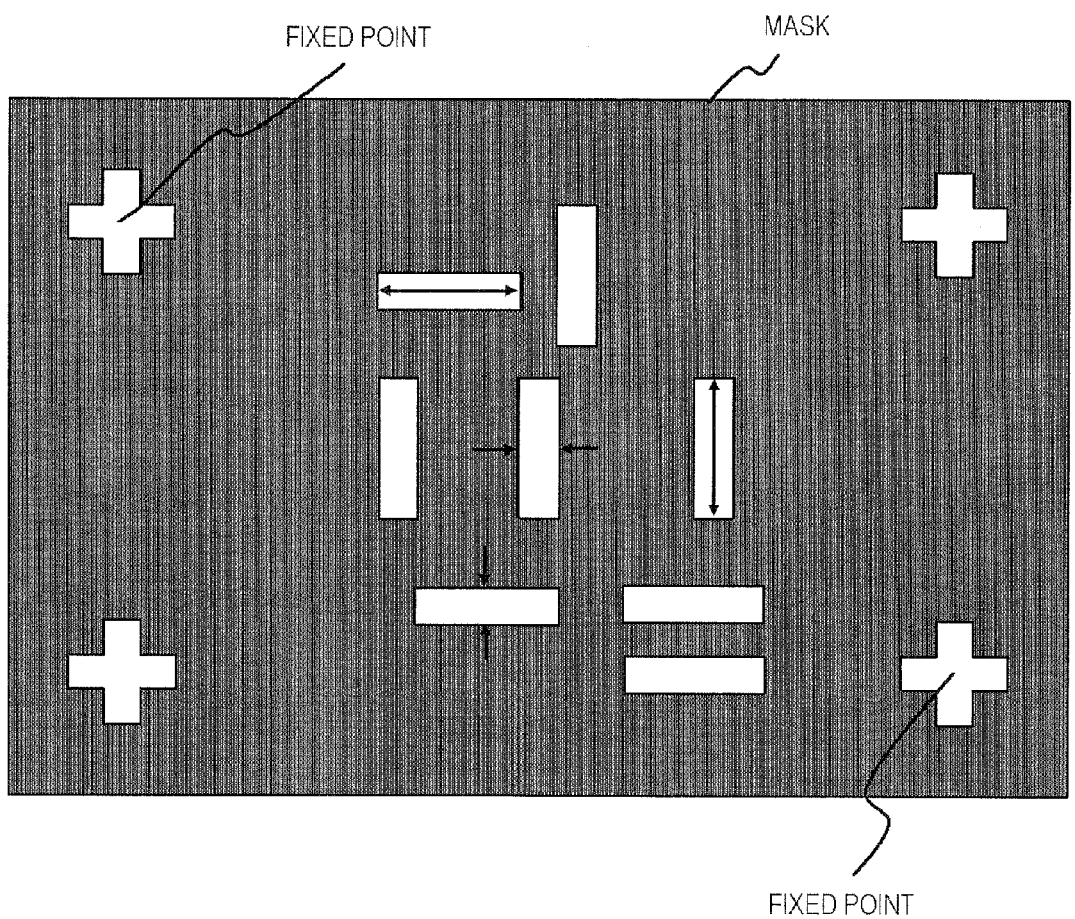
FIG. 16 is a plan view of a mask pattern for explaining the fixed point.

Details of the operation of the simulation system 3 will now be described as a third embodiment of the simulation method according to the present invention, referring to FIG. 7 showing the flowchart of the operation, and to FIG. 8 regarding the important portion of the calculation process (enclosed by dotted lines in FIG. 7). The steps S11 and S12 are generally the same as in the first embodiment (Ref. FIG. 2), and hence the description thereof will not be repeated.

After the step S12, the light intensity I(x, y) is calculated as in the first embodiment (S33a). To incorporate the molecule diffusion effect produced by the post-bake process applied to the photoresist, a value obtained through convolution integration of I(x, y) with at least one of the Gaussian functions having a tentative diffusion length is determined as a post-diffusion modified light intensity (Idiff(x, y)) (S33b). Based on partial differentiation at x, y of the post-diffusion light intensity (Idiff(x, y)), the post-diffusion light intensity gradient (slope_diff(x, y)) is calculated through the following equation (S34).

$$\text{slope\_diff}(x,y) = [\{(\partial/\partial x)I\text{diff}(x,y)\}^2 + \{(\partial/\partial y)I\text{diff}(x,y)\}^2]^{1/2} \quad (7)$$

The post-diffusion light intensity gradient and the post-diffusion light intensity are then multiplied, as follows (S35):

$$\text{Idiff}(x,y)*\text{slope\_diff}(x,y) \quad (8)$$

The optical reaction coefficient (coef) is tentatively given, so that a light intensity signal corresponding to the photochemical reaction in the region where the light intensity gradient is steep in the nanometer level range is given as the following formula (S36):

$$\text{coef}*\text{Idiff}(x,y)*\text{slope\_diff}(x,y) \quad (9)$$

Adding the light intensity signal corresponding to the photochemical reaction in the region where the light intensity gradient is steep in the nanometer level range to the initial light intensity leads to obtaining the modified post-diffusion light intensity signal Idiff_m(x, y) as follows (S37):

$$\text{Idiff\_m}(x,y) = \text{Idiff}(x,y) + \text{coef}*\text{Idiff}(x,y)*\text{slope\_diff}(x,y) \quad (10)$$

In the subsequent steps, the modified post-diffusion light intensity Idiff_m(x, y) is treated as the "modified light intensity signal".

Giving various values to the threshold value under the modified light intensity signal (Idiff_m(x, y)) leads to obtention of two edges x01 (strictly, (x01, y00)) and x02 (strictly, (x02, y00)) where the measured CD agree with the calculated value CD, as well as the threshold value Th0 that is equal at the two edges (S38).

The threshold value thus obtained is then applied to the regression calculation (statistic processing) (S39). Once the condition that makes the difference between the calculated value (calculated CD) and the measured value (measured CD) minimal is satisfied, the optical parameter, the optical reaction coefficient (coef), the diffusion length and the threshold value which have so far been undetermined constants are determined, thus completing the lithography model. If the condition is not satisfied, different values are given to the optical parameter, the photochemical reaction ratio (coef), and the threshold value until the condition is satisfied (S40). The coefficient coef and the diffusion length may be in a range of 0.02 to 0.2 [μm] and 0.0 to 0.05 [μm] respectively, as in the second embodiment. Upon practically executing this embodiment, the regression calculation was converged when the coefficient (coef) and the diffusion length were within such range.

Here, a third embodiment of the method of modifying the mask pattern according to the present invention represents the case of modifying the foregoing mask pattern utilizing the lithography model established by the simulation method according to this embodiment.

This embodiment incorporates the influence of the post-bake process performed after the exposure for heating the photoresist. Such arrangement allows executing the empirical lithography simulation with higher accuracy than the first embodiment. It is to be noted that in this embodiment the steps of the diffusion process is different from that of the second embodiment. From the viewpoint of the chemical reaction process the second embodiment is more accurate, however this embodiment offers the advantage that, because of handling a fewer number of optical parameters, the calculation is simpler and hence the calculation for the OPC process based on the lithography model can be performed relatively quicker. Other advantageous effects of this embodiment are generally the same as those offered by the first embodiment.

Here, in the case where the pattern density can be handled approximated with the Gaussian function like the diffusion effect by in the post-bake process, it is obvious that the pattern density can be processed as described referring to the first and the second embodiment, and hence the description will not be specifically made.

It is also to be noted that this embodiment is different from the second comparative example (Ref. FIGS. 19 and 20). In the second comparative example, post-diffusion light intensity is employed, which is obtained through convolution integration with a Gaussian function having a tentative diffusion length. In this embodiment, modified post-diffusion light intensity is employed, which is obtained by adding the post-diffusion light intensity corresponding to the photochemical reaction in the region where the post-diffusion light intensity gradient is steep in the nanometer level range.

The simulation method, the simulation system, and the method of modifying a mask pattern according to the present invention are not limited to the foregoing embodiments, but various modifications may be made. For example, although the foregoing embodiments specify the range of the tentative reaction coefficient and the tentative diffusion length as 0.2 [μm] and 0.0 to 0.05 [μm] respectively, it is not mandatory that the tentative reaction coefficient and the tentative diffusion length remain within such range, and any value outside of such range may be applied as long as the regression calculation can be converged. Also, the present invention may be suitably applied to an optical lithography process performed in a manufacturing process of a semiconductor device, an LCD device and so forth.

It is apparent that the present invention is not limited to the above embodiment, and may be modified and changed without departing from the scope and spirit of the invention.

What is claimed is:

1. A simulation method using a computer that provides, through simulation, information on a transfer pattern to be produced on a wafer upon transferring a predetermined mask pattern thereto by optical photolithography, comprising the steps of the computer:

accepting an input of a measured dimension of said transfer pattern;

calculating a light intensity at each of a plurality of positions on said transfer pattern;

calculating a light intensity gradient at each of said positions based on said light intensity;

multiplying said light intensity, a tentative optical reaction coefficient and said light intensity gradient to thus obtain a modified value, and adding said modified value to said light intensity thereby giving a modified light intensity; and deciding a threshold value and an optical reaction coefficient by regression calculation such that a difference between said measured dimension and a calculated dimension becomes minimal under said modified light intensity, employing as a constant said threshold value of said light intensity at a pair of edges that define said calculated dimension of said transfer pattern in said simulation.

2. The simulation method according to claim 1, wherein said calculating a modified light intensity includes calculating a modified light intensity through convolution integration of the sum of said light intensity and said modified value, and a Gaussian function having a tentative diffusion length; and said deciding a threshold value and said optical reaction coefficient further includes deciding a diffusion length, in addition to said threshold value and said optical reaction coefficient.

3. The simulation method according to claim 1, further comprising:

calculating a post-diffusion light intensity through convolution integration of said light intensity and a Gaussian function having a diffusion length; and calculating a post-diffusion light intensity gradient at each of said positions based on said post-diffusion light intensity;

wherein said calculating a modified light intensity includes multiplying said post-diffusion light intensity, said optical reaction coefficient, and said post-diffusion light intensity gradient to thus obtain said modified value, and adding said modified value to said post-diffusion light intensity, thereby giving said modified light intensity; and said deciding a threshold value and said optical reaction coefficient further includes deciding said diffusion length, in addition to said threshold value and said optical reaction coefficient.

4. A method of modifying a mask pattern, comprising utilizing a lithography model obtained through said simulation method according to claim 1, to thereby modify said mask pattern.

5. A simulation system that provides, through simulation, information on a transfer pattern to be produced on a wafer upon transferring a predetermined mask pattern thereto by optical photolithography, comprising:

a unit accepting an input of a measured dimension of said transfer pattern;

a unit calculating a light intensity at each of a plurality of positions;

a unit calculating a light intensity gradient at each of said positions based on said light intensity;

a unit multiplying said light intensity, a tentative optical reaction coefficient and said light intensity gradient to thus obtain a modified value, and adds said modified value to said light intensity thereby giving a modified light intensity; and a unit deciding a threshold value and an optical reaction coefficient by regression calculation such that a difference between a calculated dimension and said measured dimension becomes minimal under said modified light intensity, employing as a constant said threshold value of said light intensity at a pair of edges that define said calculated dimension of said transfer pattern in said simulation.

\* \* \* \* \*